US007158379B2

(12) United States Patent
Sanders et al.

(10) Patent No.: US 7,158,379 B2
(45) Date of Patent: Jan. 2, 2007

(54) DEVICE FOR REMOVING HEAT FROM A POWER CONNECTOR

(75) Inventors: David K. Sanders, Los Gatos, CA (US); Martin D. Lavoie, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 249 days.

(21) Appl. No.: 10/734,715

(22) Filed: Dec. 12, 2003

(65) Prior Publication Data

US 2005/0128707 A1     Jun. 16, 2005

(51) Int. Cl.
H05K 7/20     (2006.01)
H01R 13/00     (2006.01)

(52) U.S. Cl. ............... 361/703; 361/692; 361/694; 361/719; 439/79; 439/206; 439/485; 439/947

(58) Field of Classification Search ........ 361/719–721, 361/687, 694, 695, 690, 697, 703; 439/485–487, 439/196, 541.5, 79–80, 206, 947; 454/184
See application file for complete search history.

(56) References Cited

U.S. PATENT DOCUMENTS

| | | | | |
|---|---|---|---|---|
| 4,839,774 A * | 6/1989 | Hamburgen | ............... | 361/693 |
| 5,478,221 A * | 12/1995 | Loya | ........................ | 417/313 |
| 5,513,070 A * | 4/1996 | Xie et al. | ................... | 361/700 |
| 5,630,469 A * | 5/1997 | Butterbaugh et al. | ...... | 165/80.3 |
| 5,680,295 A * | 10/1997 | Le et al. | ..................... | 361/695 |
| 5,860,291 A * | 1/1999 | Johnson et al. | ............ | 62/259.2 |
| 5,936,839 A * | 8/1999 | Saito | .......................... | 361/707 |
| 5,995,368 A * | 11/1999 | Lee et al. | .................... | 361/695 |
| 6,014,319 A * | 1/2000 | Kuchta et al. | .............. | 361/788 |
| 6,027,535 A * | 2/2000 | Eberle et al. | ............... | 361/690 |
| 6,137,682 A * | 10/2000 | Ishimine et al. | ............ | 361/704 |
| 6,144,556 A * | 11/2000 | Lanclos | ...................... | 361/695 |
| 6,175,493 B1* | 1/2001 | Gold | ......................... | 361/687 |
| 6,198,629 B1* | 3/2001 | Cannon et al. | ............ | 361/695 |
| 6,213,866 B1* | 4/2001 | Impellizzeri | ............... | 454/184 |
| 6,219,242 B1* | 4/2001 | Martinez | .................... | 361/704 |
| 6,239,971 B1* | 5/2001 | Yu et al. | ..................... | 361/695 |
| 6,452,797 B1* | 9/2002 | Konstad | ..................... | 361/695 |
| 6,454,260 B1* | 9/2002 | Noolandi et al. | ........... | 273/108 |
| 6,514,103 B1* | 2/2003 | Pape et al. | .................. | 439/608 |
| 6,574,108 B1* | 6/2003 | Kramer et al. | ............. | 361/719 |
| 6,575,776 B1* | 6/2003 | Conner et al. | ............. | 439/206 |
| 6,733,302 B1* | 5/2004 | Smalley et al. | ............... | 439/65 |
| 6,796,831 B1* | 9/2004 | Yasufuku et al. | ........... | 439/485 |
| 6,814,590 B1* | 11/2004 | Minich et al. | ................ | 439/79 |
| 6,835,070 B1* | 12/2004 | Law | ............................. | 439/61 |
| 6,882,108 B1* | 4/2005 | Kim et al. | ................... | 313/582 |
| 2001/0003685 A1* | 6/2001 | Aritani | ....................... | 439/485 |
| 2003/0219999 A1* | 11/2003 | Minich et al. | ................ | 439/79 |
| 2003/0226688 A1* | 12/2003 | Jairazbhoy et al. | ......... | 174/252 |

\* cited by examiner

*Primary Examiner*—Michael Datskovsky
*Assistant Examiner*—Robert J. Hoffberg
(74) *Attorney, Agent, or Firm*—Marger Johnson & McCollom, P.C.

(57) ABSTRACT

A heat removal device includes a shroud on a top side of a printed circuit board that contains a power connector. An air intake vent is located underneath the printed circuit board and directs air up through printed circuit board vias into the shroud. Openings are located in a power connector housings that allow air to flow over conductors in the connector and out an air outtake vent. The conductors include heat sink fins that extend out of the openings in the connector housing.

30 Claims, 5 Drawing Sheets

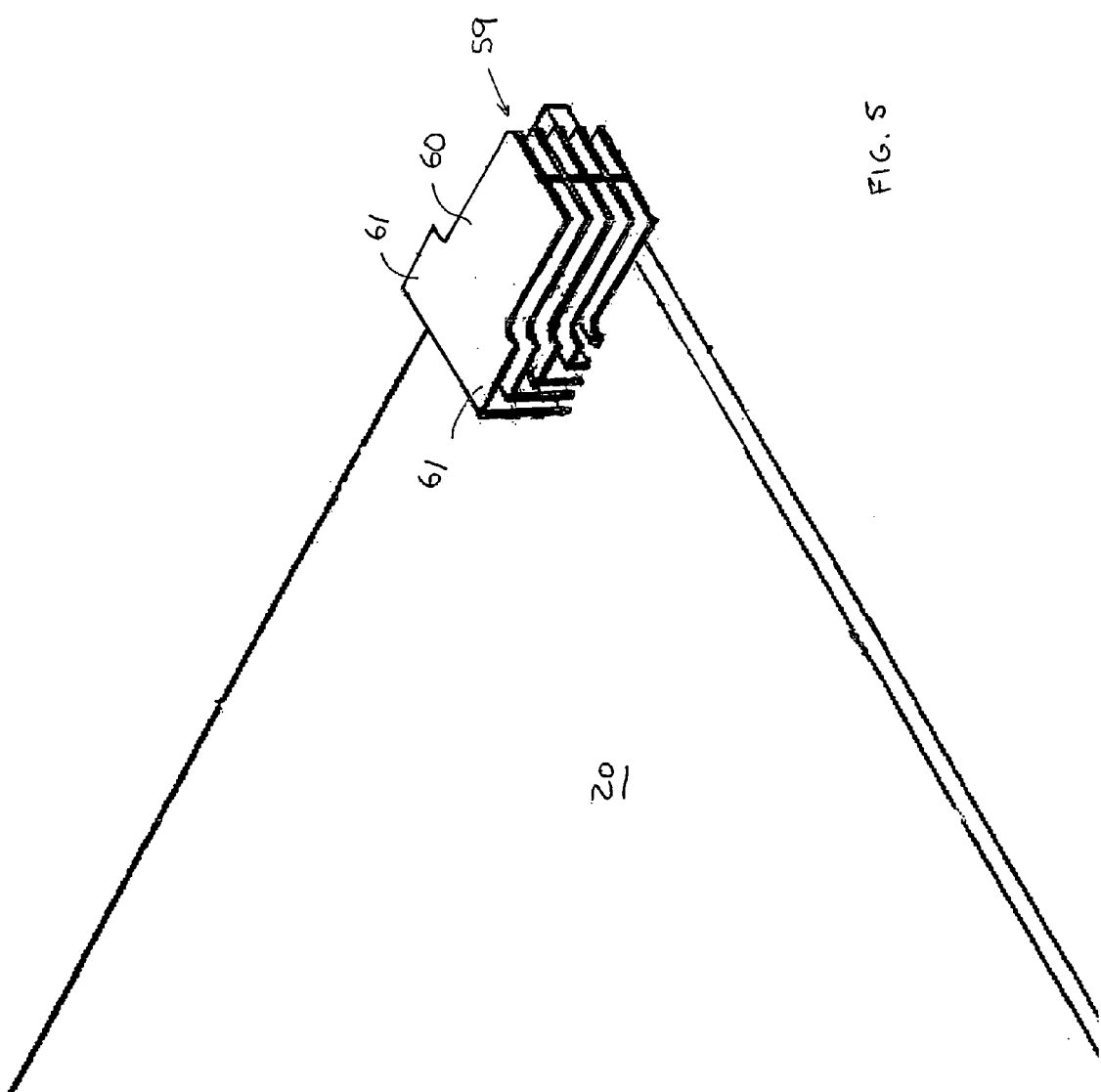

DEVICE FOR REMOVING HEAT FROM A POWER CONNECTOR

BACKGROUND

Electrical equipment may include multiple printed circuit boards that are located within the same chassis. In one example, the electrical equipment is network processing equipment, such as a router, switch, concentrator, gateway, etc. The network processing equipment may include multiple line cards that provide interfaces for establishing multiple network connections. The line cards establish individual connections to computers, servers, Voice Over Internet Protocol (VoIP) phones, etc. The network processing equipment route or switch data on the connections over a Wide Area Network (WAN) or Local Area Network (LAN).

The line cards are powered using power connectors. The power supplied by the power connectors generate heat on the line cards and in the chassis containing the line cards. Too much heat can damage the electrical traces and electrical components on the line cards. Thus, the amount of power that can be supplied to the line cards in the network processing equipment is limited by the amount of heat generated.

More power is required to increase processing capacity in network processing equipment. For example, some network processing equipment applications can require more than 200 amps of power. This is equivalent to the current rating on an electrical panel in a residential home. However, printed circuit boards in existing network processing equipment cannot withstand the heat generated by this much power. These heat restrictions severely limit the processing capacity of network processing equipment.

The present invention addresses this and other problems associated with the prior art.

SUMMARY OF THE INVENTION

A heat removal device includes a shroud on a top side of a printed circuit board that contains a power connector. An air intake vent is located underneath the printed circuit board and directs air up through printed circuit board vias into the shroud. Openings are located in a power connector housings that allow air to flow over conductors in the connector and out an air outtake vent. The conductors include heat sink fins that extend out of the openings in the connector housing.

BRIEF DESCRIPTION OF THE DRAWINGS

FIG. 5 is an isolated view of conductor plates located inside a power connector.

DETAILED DESCRIPTION

Figure 1:
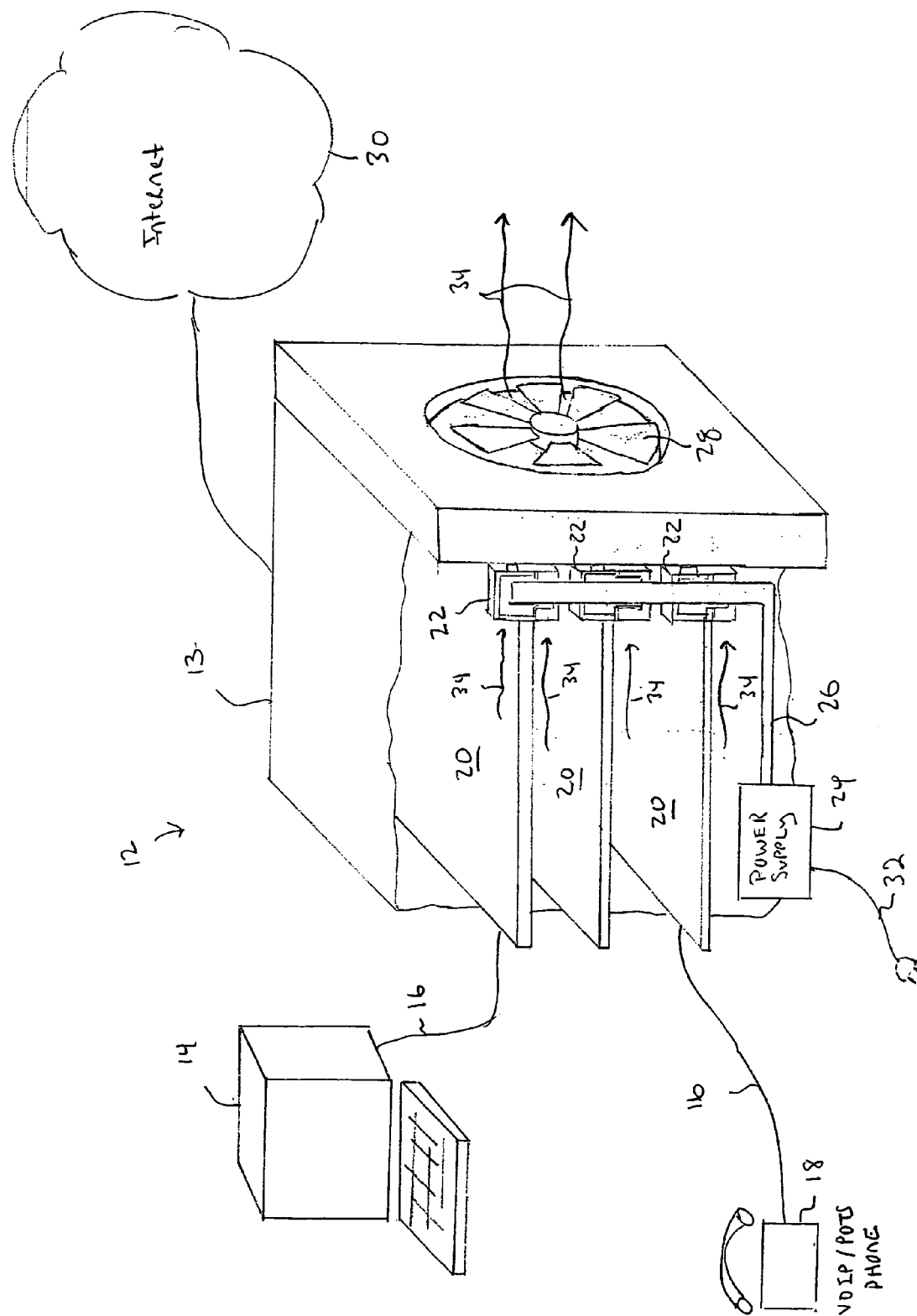
FIG. 1 is a cutaway view of network processing equipment.

FIG. 1 shows network processing equipment 12 that establishes connections 16 with multiple computers 14 or phones 18. The connections 16 can be established over a land line or wireless medium and are carried over a circuit switched network or a packet switched network. The phone 18 can be a Plain Old Telephone Service (POTS) phone or a Voice Over Internet Protocol (VoIP) phone.

The network processing equipment 12 routes or switches data on connections 16 over a Wide Area Network (WAN) or Local Area Network (LAN) packet switched network referred to generally as Internet network 30. In one embodiment the network processing equipment 12 is a router, switch, call concentrator, gateway, or any other type of network processing circuitry that processes packet data. However, it should be understood, that this is just a preferred embodiment and the heat removal system described below can be used for any type of electrical equipment.

The network processing equipment 12 includes multiple line cards 20 that each process data for connections 16. The line cards 20 are contained within a chassis 13 and each receive power from a power supply 24. The power supply 24 includes a plug 32 for plugging into a wall power outlet (not shown). The power supply 24 converts Alternating Current (A.C.) power from the wall power outlet to a lower voltage used for operating electrical components on the line cards 20.

A power cable 26 runs from the power supply 24 to individual heat removal devices 22. The heat removal devices 22 each include a power connector 40 (FIG. 2) that physically connects power from the power supply 24 to power planes on the printed circuit boards 20. The heat removal devices 22 are located next to a fan 28 that sucks air out of the chassis 13 creating air flow 34.

Figure 2:
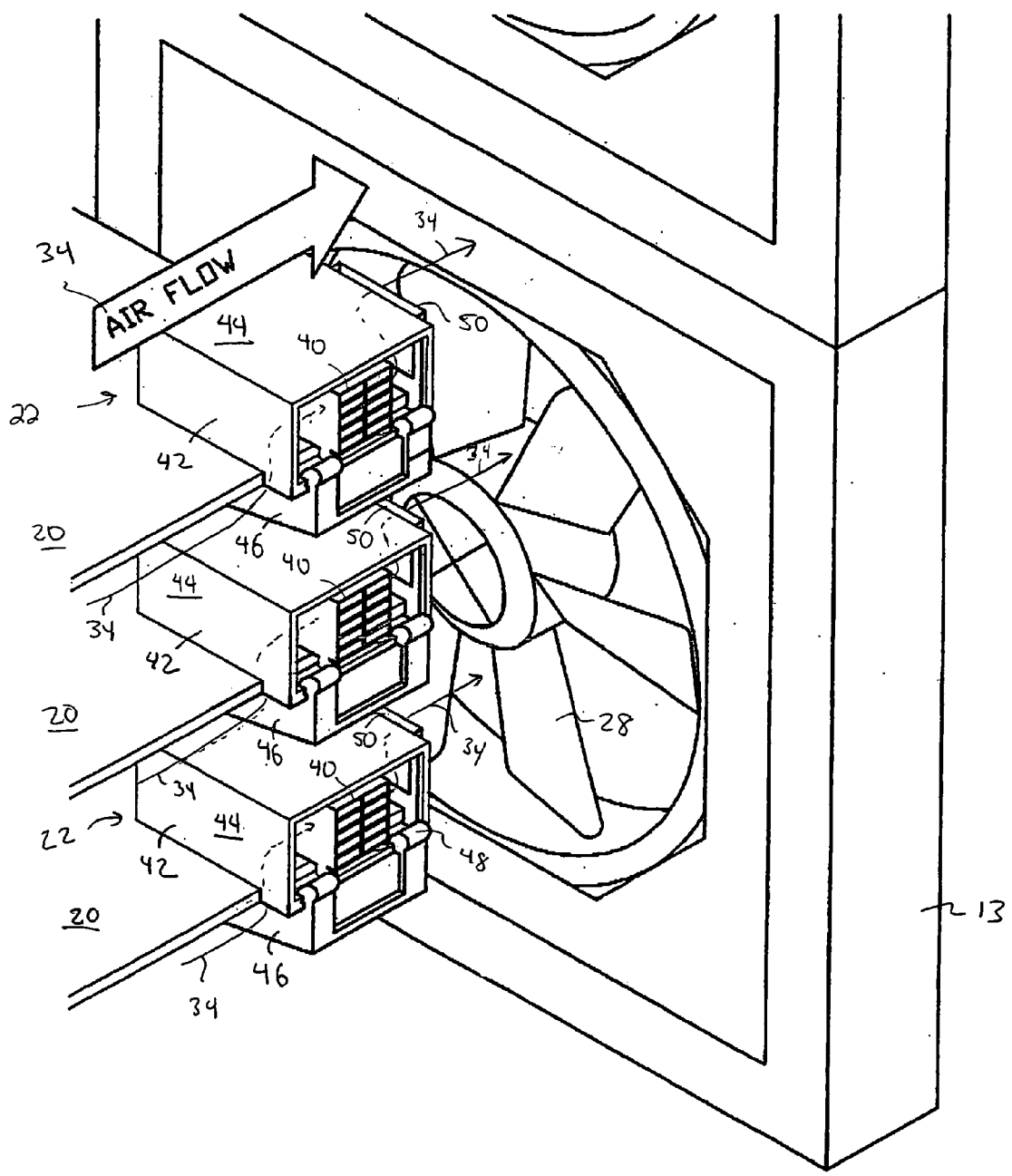
FIG. 2 is an enlarged view of heat removal devices located in the network processing equipment.

Referring to FIG. 2, the heat removal devices 22 include power connectors 40 that are plugged into contact holes (vias) in the printed circuit boards 20. In one embodiment, the power connector 40 is incorporated into an industry standard bladed Future Bus connector. However, the invention can also be incorporated into other types of power connectors.

The Future Bus connector is modified by exposing internal conductors and fanning out the conductor blades to extend outside a plastic connector housing. An air flow control device 42 includes an upper shroud 44 that sits on a top side of the circuit board 20 and contains the power connector 40. The air flow control device 42 also includes an air intake vent 46 that attaches to a bottom side of the circuit board 20 and is connected to the upper shroud 44 by a hinge 48. The air flow control device 42 can be made from plastic or any other material.

The fan 28 is located in the chassis 13 adjacent to the heat removal devices 22. In one embodiment there are multiple fans 28 stacked on top of each other on one side of the chassis 13. Exhaust vents 50 are located on the right side of each shroud 44. The fan 28 sucks air out from the exhaust vents 50. In an alternative embodiment, instead of pulling air from the exhaust air vents 50, the fan 28 is located on the opposite left side of the chassis 13 and blows air into the intake air vent 46.

As described in further detail below, the configuration of the air flow control device 42 in relation to the fan 28 creates a low pressure area on the top sides of the circuit boards 20. This low pressure causes air flow 34 from the bottom sides of the circuit boards 20 to travel up through vias 52 (see FIGS. 3 and 4) in the printed circuit boards 20. The upwardly traveling air flow 34 is then sucked by the fan 28 through the power connectors 40 and out the exhaust vent 50.

Figure 3:
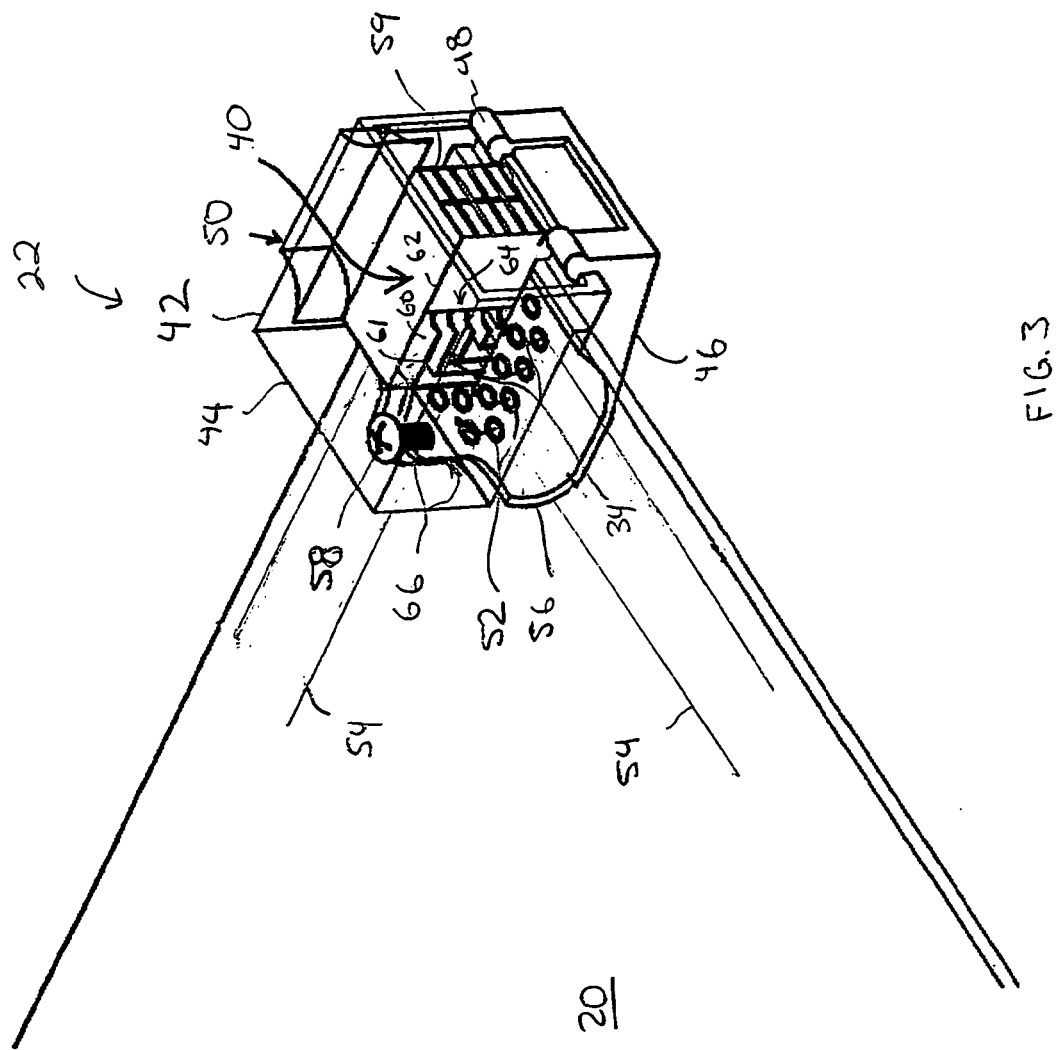
FIG. 3 is an isolated view of one of the heat removal devices with an upper shroud shown with see-through lines.

FIG. 3 shows one of the heat removal devices 22 with the shroud 44 and the printed circuit board 20 drawn with see through lines. The connector 40 includes multiple conductor blades 60 that electrically connect the power cable 26 (FIG.

1) to power planes 54 that extend along the circuit board 20. Front connecting face 59 of the connector 40 electrically receives a plug from power cable 26. The conductors 60 are contained within a plastic housing 62.

Of particular interest are openings 64 that exist on opposite sides of the housing 62. In one embodiment, at least one side of the housing 62, other than the front connecting face 59, includes an opening 64 for promoting air flow across the conductors 60. A large amount of heat can be generated by the conductors 60. The openings 64 in combination with the directed air flow provided by the air flow control device 42 increases the amount of heat transferred away from the conductors 60. In one embodiment, the conductors 60 include fins 61 that fan out from opposite sides of the conductors 60 and extend out of the housing opening 64. The conductor fins 61 operate as heat sinks thermally removing heat from the conductors 60.

The air intake vent 46 is held underneath the printed circuit board 20 by the hinge 48 and a screw 58. The screw 58 inserts though a hole in an extension piece 66 of the shroud 44 and a hole in the circuit board 20. The screw 58 is received by a corresponding extension piece 66 in the air intake vent 46. The air intake vent 46 includes a cowling 56 that directs air from underneath the printed circuit board 20 up through circuit board vias 52 and into the opening 64 in the connector housing 62. This air flow travels over the conductors 60, out the opening in the opposite side of the housing 62 and then out exhaust vent 50.

Another source of heat, in addition to the conductors 60, is the areas of the power planes 54 that make physical contact with the conductors 60. The vias 52 are connected to the power planes 54. The heat removal device 22 causes air to flow up through the vias 52 and remove heat generated at the contact points between the conductors 60 and the power planes 54. In one embodiment, the vias are around 50 millimeters in diameter.

Figure 4:
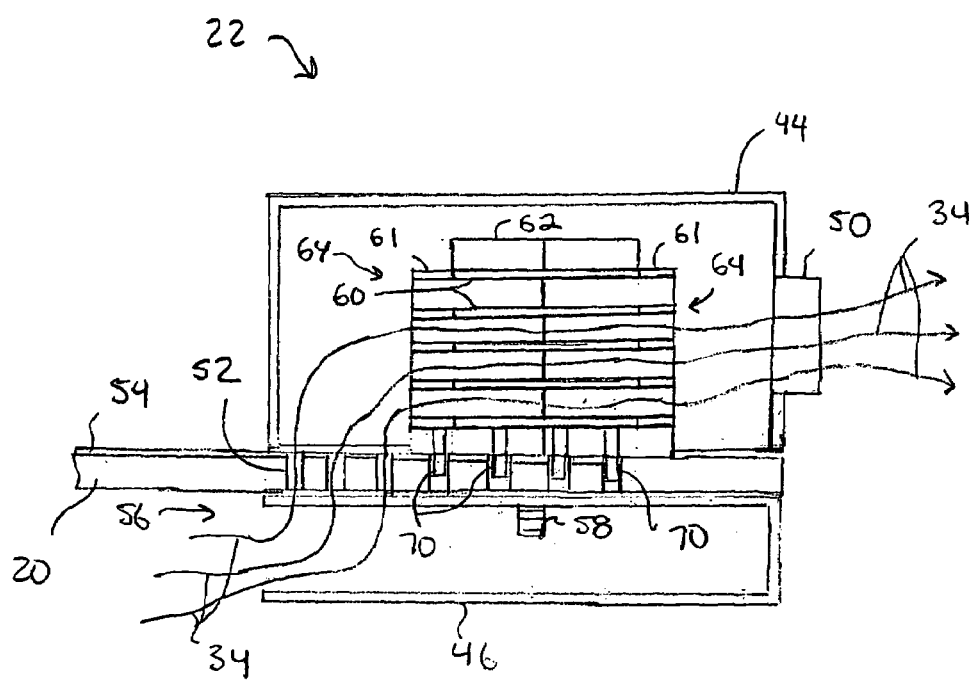
FIG. 4 is front cutaway view of the heat removal device.

FIG. 4 is a front-sectional view of the heat removal device 22. The conductors 60 are electrically connected to the power plane 54 through contacts 70. These contact 70/power plane 54 physical contact areas are high heat generating areas. Air flow 34 travels from underneath the printed circuit board 20 into the air intake vent 46 and up through the vias 52. The air flow 34 travels up through the vias 52 and into the left opening 64 in the plastic connector housing 62. The air flow 34 travels over the conductors 60 and conductor fins 61 and out the right opening 64 in the housing 62. The air flow 34 then travels out of exhaust vent 50 and out of the chassis 13 via the fan 28.

FIG. 5 is an isolation view of the conductors 60 located in power connector 40. The conductors 60 include multiple metal plates that plug into vias in the circuit board 20. The conductors 60 extend up from the printed circuit board 20 and then bend forward forming the front connecting face 59 of the connector 40. Fins 61 spread laterally out from opposite sides of the conductors 60 and extend out of the openings 64 on opposite sides of the connector housing 62 (See FIG. 3).

Having described and illustrated the principles of the invention in a preferred embodiment thereof, it should be apparent that the invention may be modified in arrangement and detail without departing from such principles. I claim all modifications and variation coming within the spirit and scope of the following claims.

The invention claimed is:

1. A connector having a connecting face, comprising:
   conductors connectable through the connecting face;
   a housing substantially enclosing the conductors and including first, second and third sides, the first side coinciding with the connecting face, the second and third sides including openings on opposite sides of the housing that together form a passageway extending completely through the connector from the second side to the third side for promoting air flow across the conductors and through the housing; and
   an air flow control device configured to direct air through holes in a circuit board and into one of the housing openings.

2. A connector according to claim 1 wherein the air flows over a majority of a surface area of the conductors.

3. A connector according to claim 1 wherein the housing is attached over the circuit board.

4. A connector according to claim 1 wherein the air flow control device includes an air intake vent configured to direct air from underneath the circuit board up through vias electrically connected to the circuit board and into one of the housing openings.

5. A connector according to claim 4 including conductor pins that are inserted in some of the vias, wherein the air flow is directed through at least some of the vias not including conductor pins inserted therein.

6. A connector according to claim 1 wherein the air flow control device includes an air intake vent located below the housing and below the circuit board.

7. A connector according to claim 6 including an exhaust vent configured to vent air in a direction offset and substantially parallel to the air directed towards the intake vent, wherein the intake and exhaust vents are located in a shroud substantially enclosing the housing.

8. A connector according to claim 1 including vias electrically connected to a power plane on the circuit board, the vias located inside the air flow control device for directing air from underneath the circuit board up through the vias and across the conductors in the connector.

9. A connector according to claim 1 including parallel airways formed between the conductors for channeling the air flow in a direction substantially perpendicular to the holes in the circuit board.

10. A connector according to claim 9 wherein at least some of the holes are electrically connected to the circuit board.

11. A connector according to claim 9 wherein the airways expose a majority of a surface area of the conductors.

12. The connector according to claim 1 wherein the conductors are arranged as vertically stacked blades spaced apart by horizontal channels extending from the second side of the housing to the third side of the housing, the openings allowing air to pass in through the opening on the second side of the housing, through the horizontal channels over a majority of a surface area of the vertically stacked conductor blades, and pass out the opening in the third side of the housing.

13. A heat removal system, comprising:
    a circuit board power connector including electrical contacts for inserting into a first set of contact holes electrically connected to a circuit board; and
    a device attached over the circuit board power connector for directing air from underneath the circuit board up through a second set of contact holes, through the power connector and out an output vent for directing heat away from the power connector.

14. A heat removal system according to claim 13 including an air intake vent located on an underside of the printed circuit board for directing air up through the second set of contact holes in the printed circuit board.

15. A heat removal system according to claim 13 including openings in a power connector, the device directing the air into a first one of the openings, through parallel passageways formed between upper and lower surfaces of conductors housed in the connector, out a second one of the openings, and out the output vent.

16. A heat removal system according to claim 15 wherein the air directed out the output vent is substantially parallel to the air directed through the conductors.

17. A heat removal system according to claim 13 wherein the air directed out the output vent is substantially perpendicular to the air directed through the second set of contact holes.

18. A heat removal system, comprising:
a device attached over a circuit board power connector and including an output vent for directing heat away from the power connector;
an air intake vent located on an underside of the printed circuit board for directing air up through holes in the printed circuit board and into the device; and
a hinge that couples the device with the air intake vent.

19. An air flow control device for cooling a circuit board power connector, comprising:
a unit for containing a circuit board power connector;
an air intake vent for directing air into the unit;
an air outtake vent for directing the air out of the unit; and
conductors arranged to direct the air through the power connector in channels exposing a majority of a surface area of the conductors.

20. An air flow control device according to claim 19 wherein the air intake vent is located on a side of the unit opposite that of the air outtake vent.

21. An air flow control device according to claim 20 wherein the air intake vent is located below the conductors.

22. An air flow control device according to claim 19 including conductor connections for inserting into vias electrically coupled to a circuit board power plane wherein vias not including conductor connections inserted therein provide air flow into the unit.

23. A connector, comprising:
conductors;
a housing containing the conductors; and
an air flow control device substantially enclosing the housing including an air intake vent on one side for promoting air flow through a circuit board into the housing and across parallel passageways exposing upper and lower surfaces of the conductors.

24. A connector according to claim 23 including an exhaust vent located on another side of the air flow control device for exhausting the air flow in a direction parallel to the passageways.

25. A connector according to claim 24 wherein the passageways are formed from upper and lower surfaces of the conductors.

26. A connector according to claim 23 including vias connected to the circuit board, wherein conductor contact points are inserted in some of the vias and wherein other vias allow air flow through the circuit board.

27. A method for removing heat, comprising:
directing an air flow from beneath a circuit board through a first set of electrically coupled contact holes located in the circuit board;
circulating the air past electrical contacts of conductors inserted in a second set of electrically coupled contact holes located in the circuit board; and
directing the air into a housing and through multiple passageways of the conductors.

28. A method according to claim 26 including exhausting the air in a direction substantially parallel to the air circulated through the conductors.

29. A method according to claim 28 wherein the air circulated through the conductors is substantially perpendicular to the air flow directed through the contact holes.

30. A method according to claim 27 including circulating the air through parallel planar passageways formed between the conductors located in the housing.

* * * * *